United States Patent
Fay, Jr.

(10) Patent No.: US 7,286,582 B1
(45) Date of Patent: Oct. 23, 2007

(54) OPTICAL EXTERNAL CAVITIES HAVING BREWSTER ANGLE WEDGES

(76) Inventor: Theodore Denis Fay, Jr., 21911 Bacalar Dr., Mission Viejo, CA (US) 92691

( * ) Notice: Subject to any disclaimer, the term of this patent is extended or adjusted under 35 U.S.C. 154(b) by 478 days.

(21) Appl. No.: 10/959,492

(22) Filed: Oct. 6, 2004

Related U.S. Application Data

(60) Provisional application No. 60/509,463, filed on Oct. 8, 2003.

(51) Int. Cl.
*H01S 3/13* (2006.01)

(52) U.S. Cl. .................................. 372/29.022

(58) Field of Classification Search ............. 372/6, 372/26.022
See application file for complete search history.

(56) References Cited

U.S. PATENT DOCUMENTS

| | | | | |
|---|---|---|---|---|
| 4,603,940 A * | 8/1986 | Shaw et al. | .................. | 372/6 |
| 4,907,237 A * | 3/1990 | Dahmani et al. | ............. | 372/32 |
| 5,023,885 A * | 6/1991 | Auracher et al. | ............. | 372/92 |
| 5,189,547 A | 2/1993 | Day et al. | | |
| 5,189,676 A * | 2/1993 | Wysocki et al. | .............. | 372/6 |
| 5,319,668 A | 6/1994 | Lueke | | |
| 5,339,324 A * | 8/1994 | Eguchi et al. | ......... | 372/29.022 |
| 5,528,612 A * | 6/1996 | Scheps et al. | ............... | 372/23 |
| 5,617,206 A | 4/1997 | Fay | | |
| 5,867,512 A | 2/1999 | Sacher | | |
| 5,995,521 A | 11/1999 | Moore et al. | | |
| 6,084,998 A * | 7/2000 | Straayer | ...................... | 385/37 |
| 6,115,401 A | 9/2000 | Scobey et al. | | |
| 6,160,826 A * | 12/2000 | Swanson et al. | ............... | 372/20 |
| 6,229,828 B1 * | 5/2001 | Sanders et al. | ................ | 372/22 |
| 6,287,298 B1 * | 9/2001 | Nighan et al. | ................. | 606/10 |
| 6,628,682 B1 * | 9/2003 | Takehisa et al. | ....... | 372/29.022 |
| 6,661,814 B1 * | 12/2003 | Chapman et al. | .............. | 372/6 |
| 6,687,275 B2 * | 2/2004 | Lin | .............................. | 372/42 |
| 6,693,925 B2 * | 2/2004 | Hoose et al. | ................... | 372/6 |
| 6,697,192 B1 * | 2/2004 | Fan et al. | .................... | 359/349 |
| 6,930,822 B2 * | 8/2005 | Boggy et al. | ............... | 359/330 |
| 7,038,781 B2 * | 5/2006 | Pang et al. | .................. | 356/450 |
| 2003/0152307 A1 * | 8/2003 | Drasek et al. | ................. | 385/12 |
| 2004/0196874 A1 * | 10/2004 | Spiegelberg et al. | ........... | 372/6 |
| 2005/0169324 A1 * | 8/2005 | Ilday et al. | .................... | 372/18 |
| 2006/0029110 A1 * | 2/2006 | Cho et al. | ........................ | 372/6 |
| 2006/0065640 A1 * | 3/2006 | Lizotte et al. | .......... | 219/121.61 |
| 2006/0120412 A1 * | 6/2006 | Liu | ............................... | 372/6 |
| 2006/0165134 A1 * | 7/2006 | Tabirian et al. | ................. | 372/6 |
| 2007/0008995 A1 * | 1/2007 | Oozeki et al. | ......... | 372/29.011 |

* cited by examiner

*Primary Examiner*—Deandra M Hughes
(74) *Attorney, Agent, or Firm*—Walter A. Hackler

(57) ABSTRACT

This invention consists of an optical external cavity having specialized Brewster angle wedges. The external cavity apparatus utilizes several types of very high index of refraction wedges made from semiconductor and special glass materials. The apparatus limits the oscillation of the optical wavelength modes emitted by a diode laser. In addition, such cavities also simplify the motions of the moveable mirror that returns these selected laser photons to the cavity input beam path or fiber. The wedge also disperses the laser light to isolate the desired wavelength band better than the currently used grating systems. Wavelengths other than the desired wavelength band are dispersed, then reflected at angle away from the return fiber and thus not returned to the amplification cavity inside the laser. The apparatus then emits only the laser photon mode desired by the user.

19 Claims, 1 Drawing Sheet

OPTICAL EXTERNAL CAVITIES HAVING BREWSTER ANGLE WEDGES

PRIORITY CLAIM

This application claims priority to U.S. Provisional Application 60/509,463 filed on 8 Oct. 2003.

FIELD OF THE INVENTIONS

The inventions described below relate the field of optics and spectroscopy, and specifically to optical external cavities used to control laser light.

BACKGROUND OF THE INVENTIONS

There is an urgent need to improve the performance of diode laser systems. The overall commercial laser market has expanded from $4B in 1998 to about $6B in 2002. The diode laser share of this market has remained stagnant at about 33% during the past four years, due in part to the high complexity of current pivot mirrors that control the laser cavities. The associated fabrication costs limit several key applications of these lasers. Despite these limitations, financial investment in the diode share of the laser market remains surprisingly strong. Private investment in novel optical components has only declined from $1.8B to $1.1B during the past year. During this same period investment in new ventures in the U.S. has suffered a much more drastic decline, from a high of $134B in 2000 to less than $30B after 2002, due in large part to an ongoing recession associated with the violent events beginning in September 2001.

This relative vote of confidence of investors in the overall laser market is due in large part due to the large increases in defense applications expected in coming years. A second growth factor is the surprisingly strong growth in sales of optical systems for fluorescence sensors recently (currently doubling every 3 to 5 years). This industry can contribute to the market growth of visual diode lasers, since they are often the least expensive and most compact laser technologies to be used as light sources in these fluorescence systems. These light sources are currently used to excite all the recently developed blue, green and red dyes for detection of many novel types of fluorescent polymers. The rapid growth of the number of fluorescent agents has dramatically increased the accuracy of biochemical detection for an increasingly wide variety of proteins, enzymes, antibodies and nucleic acids. There is an expanding need for these optical products in the fields of agribusiness, food processing, environmental sensors, laboratory work and process efficiency monitors. The pharmaceutical, biotechnology and medical industries are becoming increasingly dependent on a wide variety of inexpensive optical testing and monitoring of many critical processes used in many areas, from food safety to drug production.

Current diode laser systems do have disadvantages relative to gas and other solid-state lasers. If these lasers are not controlled by external cavities, they will unpredictably change their output wavelength. These are called internal cavity mode hops. The internal Fabry-Perot cavities that generate the laser light are capable of operating in a number of possible modes (orders). These modes are made possible by the different thickness of the semiconductor quantum wells that form this cavity. Each laser mode will radiate at a specific narrow band of wavelengths. Shifts in these modes occur randomly and are also induced by temperature or voltage drifts, resulting in changes in the spectrum of the output beam. Several external cavity designs can greatly reduce the spectral variations of the laser by redirecting only a narrow portion of the potential spectrum toward the internal cavity. Diode lasers are one of the most compact and least expensive laser technologies, so their control systems should also be correspondingly inexpensive and compact.

Scoby and Zhang (2000) disclose a laser cavity with a monolithic prism assembly, but such a prism design does not disperse light. Sacher (1999) discloses a tuning arrangement for a semiconductor diode laser using a rectangular prism refraction grid, but there are large reflective losses from the surfaces of these prisms and the dispersion is lower than for the Brewster angle wedges. There are many other examples of earlier patents using several types of prisms besides those referenced here, but all lack certain capabilities. For example, they all employ a classical prism and are thus expensive to mount and adjust. (Specific semiconductor prisms, e.g. those made of ZnSe, have been successfully used for spectroscopy and are now covered by the patent authored by Fay (1997). However, there is a need to improve cavities for laser diodes.)

Two broad examples of laser cavity control systems that do not use prisms or wedges are: the Littman Metcalf (grating and retro-reflector) and the Pound, Drever and Hall (Fabry-Perot and phase modulator) systems. Present Littman Metcalf designs require very complex pivot motion control. They also have lower spectral resolution and efficiency than the Brewster angle wedge designs claimed in this provisional patent. Past inventions have attempted to overcome the basic design deficiencies of these external cavities by increasing both their size and the cost. The laser diodes themselves can be purchased from a number of manufacturers for between $1000 and $10,000, their cost depends on the power requirements demanded by the customer. The fabrication cost of high quality external cavities is now higher than the laser diode that is to be controlled. These cavities can be purchased at New Focus for between $15,000 and $30,000 for Littman Metcalf optics and over $50,000 for the Pound, Drever and Hall optics. The least expensive biochemical fluorescent systems cost just a little over $50,000, and these do not employ stabilized cavity lasers. An external diode laser cavity with lower fabrication costs will both reduce the cost of fluorescent devices and improve sensitivity by factors of up to ten.

Several companies manufacture a number of different kinds of external laser cavities that use gratings. Two recent examples of improved external cavity patents commercially available from New Focus are: Moore, et al. (1999) and Lueke (1994), a modification of the pivot controls for the Littman Metcalf system. The active optical element of the Littman Metcalf control system is the grating, the number of grooves limit the resolution of this system to about 10,000/cm of grating surface. The diffracted light from this grating is simply retro-reflected back toward the grating at a particular angle by a mirror or wedge that must both rotate and translate on a pivot assembly. The sine of the chosen diffraction angle to be pivoted is directly related to the wavelength through the groove spacing.

The Littman Metcalf grating method uses precision optical surface grooves (quarter wavelength or less) to diffract the laser light of a given wavenumber at a particular cavity angle required for a stabilized feedback. The translation motion of the reflector is set precisely (sub micron accuracy) to give a cavity whose optical path is either an integral or half integral of the desired wavelength. The grating has an angular dispersion parameter that is proportional to the tangent of the blaze angle of the grating. This dispersion parameter limits the accuracy and sensitivity of the wavelength tuning. The resolution of the grating is proportional to the product of its width, the laser wavenumber and the sine of the incident angle plus the sine of the diffraction angle.

The three major disadvantages of operating the grating at high angles of incidence to achieve high resolution are as follows. (1) The scattered light does increase with both incident and diffraction angle. Such scattered light not only results in beam energy loss, but it contaminates the spectral and spatial purity of the laser beam controlled by this type of cavity. (2) The ideal grating efficiency decreases with the increasing sine of the blaze angle and with the tangent of the diffraction angle. This particular light loss factor is due to the geometric shadow created by the tilt of the grooves (blaze) relative to the incident angle of the laser beam. (3) The reflection and absorption loss coefficients at the grating surface also generally increase with angle.

Laser beam losses at the grating contribute to laser mode hop instability. In the Littman Metcalf cavities this instability occurs near the limits of the cavity wavelength tuning range, where internal cavity light production also declines. As discussed above, the grating scatters light from only a fraction of the surface that depends on the grating blaze angle and the incident light path angle. The absorption losses at the surface of the grating depend on the coating quality. All of the above factors reduce grating performance efficiency and restrict the tuning range for diode laser systems. Littman Metcalf tuning ranges are currently as large as 10 nm at visible wavelengths (fluorescent biotechnology band applications) and up to 70 nm in the near infrared (telecommunications band applications). The widths of the latter bands are standardized; so their number depends on the tuning range.

The active element of the Pound, Drever and Hall, or PDH, cavity uses a Fabry-Perot interferometer. Day and Marsland (1993) of New Focus have one of the more recent patents on the Pound, Drever and Hall system that is currently in commercial production. The patent office now documents many other types of external cavities that employ Fabry-Perot filters. These cavities overcome many of the light loss limitations of the Littman Metcalf system described above. A Fabry-Perot with an etalon separation of 3 cm can have a wavelength resolution that can be 1000 times higher than a grating, depending on the etalon flatness and coating reflectivity. The spectral purity of these cavities can also be up to 20 times higher than a grating and their peak wavelength efficiencies can be as high as 98%. Such cavities do have their own disadvantages because interferometers have multiple orders that overlap at the same optical angle. The particular PDH solution to the spectral overlap between orders is add a phase modulator and photo-detector offset by a beam splitter. These components both monitor part of the output beam and control the spacing of the etalons with piezoelectric means. This type of control system creates an integral or half-integral number of wavelengths in the cavity.

The PDH cavity control system is more expensive than Littman Metcalf and is one reason the PDH system has not yet become as popular a commercial solution as the grating cavities. Another reason is that both the phase modulator and the photo-detector with beam splitter both remove light from the beam, reducing cavity efficiency. These losses also contribute to mode hop instability at the limits of the tuning range just as occurs in the Littman Metcalf system. The Fabry-Perot component remains an excellent optic for achieving high purity and high spectral resolution in an external cavity, often more than 100,000, or ten times that of Littman Metcalf.

Wedges made of most optical materials have not been favored in most external cavity designs in the past, because the optical materials considered have factors of 10 or lower dispersion and resolution than gratings. Fay (1997) has patented several high dispersion semiconductor wedge materials for Raman spectroscopy.

There is a need for optical cavities that can accomplish the following: (1) simplification of the pivot motions that control the cavity spectral performance, (2) factors of from 2 to 4 higher dispersions than gratings, (3) a factor of 2 to 16 increase in light throughput, or angular field of view of the input and output fiber assemblies, (4) factors of from 20% to 3 higher spectral resolution, (5) a factor of 20% higher efficiency and (6) correspondingly lower levels of scattered light by factors of 10 or more. The last advantage significantly helps in improving laser diode performance at the edges of the tuning range. In addition, (7) business needs dictate that performance of the external cavity in many applications must not add significantly to fabrication costs.

The following is a list of references, each of which is incorporated herein by reference:

Day, T. and Marsland, R. 1993 "Electro Optical Light Modulator Driven by a Resonant Electrical Circuit", U.S. Pat. No. 5,189,547, Assignee: New Focus, Mountain, View, Calif. (the Pound, Drever and Hall Fabry-Perot cavity patent).

Fay, T. 1997 "Compact Laser Diode Monitor Using Defined Laser Momentum Vectors to Cause Emission of a Coherent Photon in A Selected Direction", U.S. Pat. No. 5,617,206, Assignee: PHI Applied Physical Sciences, Mission Viejo, CA 1 Apr. 1997.

Luecke, F. 1994 "Tuning System of an External Cavity Diode Laser", U.S. Pat. No. 5,319,668, Assignee: New Focus, Sunnyvale, Calif.

Moore, B., Arnone, D., MacDonald, R. and Lueke, F. 1999 "External Cavity Laser Pivot Design" U.S. Pat. No. 5,995,521, Assignee: New Focus, Santa Clara, Calif.

Sacher, J. 1999 "Tuning Arrangement for a Semiconductor Diode Laser with an External Cavity Resonator", U.S. Pat. No. 5,867,512, Marburg, D. E.

Scobey, M. and Zhang, X. 2000 "External Cavity with a Monolithic Prism Assembly", U.S. Pat. No. 6,115,401, Assignee: Corning, OCA, Corning, N.Y.

SUMMARY

The devices and methods described below provide for the use of high dispersion wedges as external cavities for laser diodes that meet the above needs. More particularly the present invention is directed to compact, Brewster angle wedge laser cavities made of materials with high dispersion to precisely control the wavelength of the laser light and the angle of the output beam. This wedge component replaces the grating in a traditional Littman Metcalf external cavity. The major issues with the current external cavity technology can be overcome by using a high dispersion Brewster angle wedge as the dispersive element of the cavity.

The external cavity apparatus comprises one or higher index of refraction wedges made from semiconductor and special glass materials. The apparatus limits the oscillation of the optical wavelength modes emitted by a diode laser. In addition to the wedge, such cavities also have a moveable mirror to return the laser photons to the cavity input beam path or fiber. The wedge disperses the laser light to isolate the desired wavelength band. Wavelengths other than the desired wavelength band are dispersed, then reflected at an angle away from the return fiber and thus not returned to the amplification cavity inside the laser.

In prior art designs the Fabry-Perot cavity needs additional optical components to separate the closely spaced interference orders and their corresponding laser modes. The high dispersion Brewster wedges will provide the means to separate these orders with high efficiency and reduce the size of external laser cavities by a factor of two or more. Only such a high dispersion wedge will spatially separate these overlapping modes of a Fabry-Perot filter cavity with the high (over 90%) efficiencies that are highly desirable in a multi-pass laser cavity. The wedges will enable users to spatially separate different Fabry-Perot orders in external cavities at much lower costs than the PDH design. At the same time, the Brewster angle wedges will make possible a significant increase in cavity efficiency. With some custom coatings these efficiencies may approach 90% of the laser beam intensity per pass, dramatically reducing the stray light that propagates inside the cavity.

If multiple modes of the Fabry-Perot are sufficiently dispersed by the Brewster angle wedge, this component may be used without the piezoelectric feedback to isolate wavelength bands that are more than 100,000 times smaller than the wavelength itself. Thus it is possible to combine the resolution advantage of the PDH cavity with the lower costs of the Littman Metcalf cavity by fabricating a solid, fixed Fabry-Perot cavity in tandem with a high dispersion wedge. Prototypes of such a system have been fabricated and tested in our laboratory in Irvine, Calif. (The solid Fabry-Perot cavities are now available from CVI Laser Corporation. The high dispersion wedges were initially made according to the design requirements of PHI by Janos Technologies but now are also available from II-VI Corporation.)

DETAILED DESCRIPTION OF THE INVENTIONS

TABLE I

Figure 1:
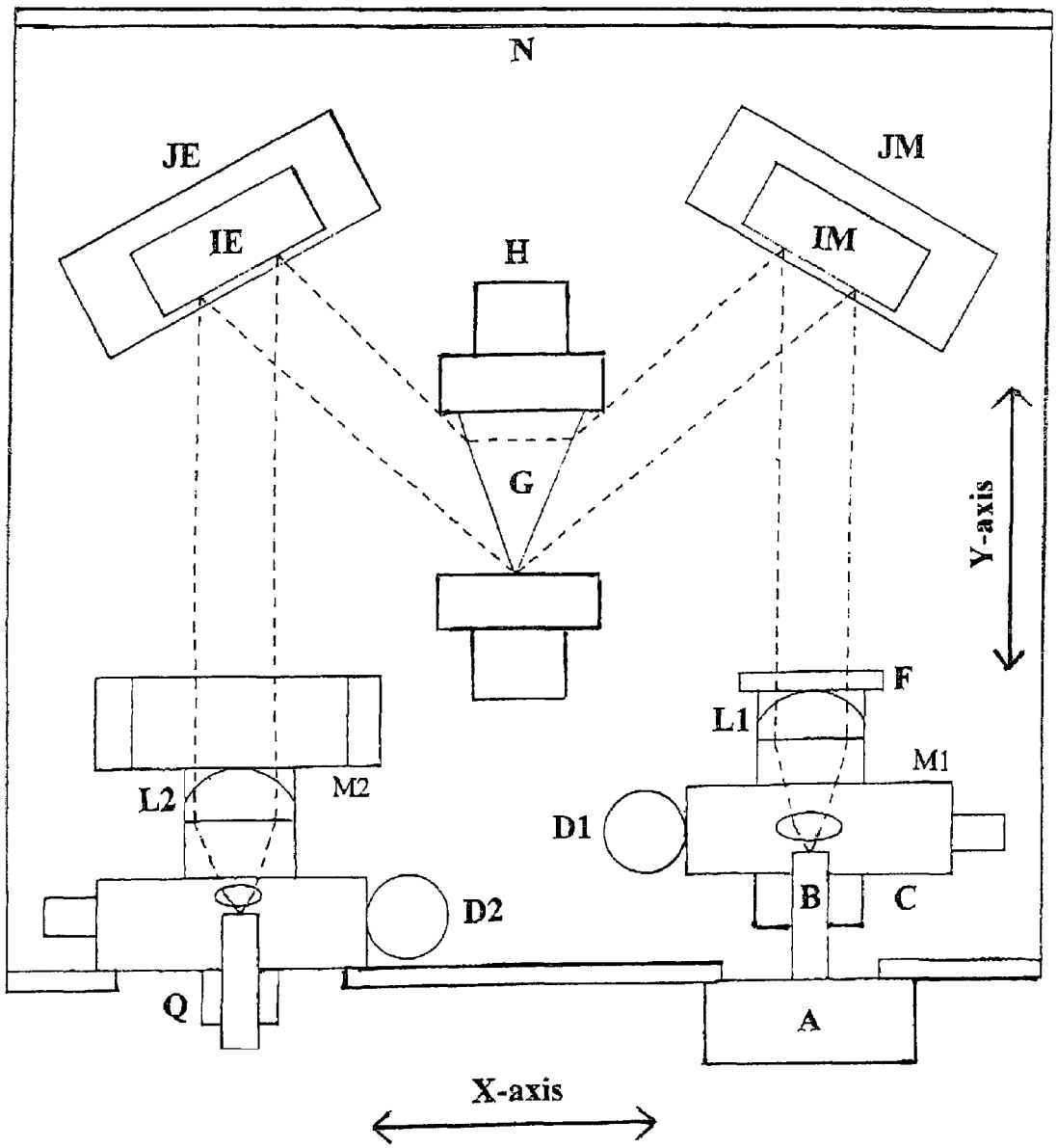
FIG. 1 shows the position of the optical components in a Brewster-angle-wedge optical external cavity.

Description of Optical Components Labeled on FIG. 1

| Optical Component, Vendor | Description of Function |
|---|---|
| A. Source & Sample cuvette and holder World Precision Instruments Coherent Laser | Excitation source, sample analyte, holder Assembly permits fluorescence to escape. |
| B. Optional input fiber, Thor Labs | Connects Sample and collimator. |
| C. Mount of input fiber, Opto Sigma | Holds fiber assembly to lens mounting. |
| D1. Mounting tube for lens L1 Opto Sigma | Holds collimator lens on Mounting M1. |
| D2. Mounting tube for lens L2 Opto Sigma | Holds camera lens on mounting M2. |
| F. Fabry-Perot or FB etalon filter CVI Laser | Isolates fluorescent light spatially and spectrally at thirty times that of the wedge. |
| G. The semiconductor wedge Two-Six Corporation | Disperses fluorescence by 1 pixel/10 cm-1 Separates Fabry-Perot & Echelle Orders. |
| H. Three axis rotation mount for The Two-Six Wedge, part G. Opto Sigma | Adjusts incident angle of dispersed spectrum Controls amount of spectral dispersion Separates Echelle orders by cross dispersion. |
| IM. Collimation Mirror | Transmits fluorences from collimator to |

TABLE I-continued

Description of Optical Components Labeled on FIG. 1

| Optical Component, Vendor | Description of Function |
|---|---|
| Opto Sigma | wedge at the proper Sub-Brewster angle. |
| IE. Echelle Grating Richardson Grating Laboratory | Disperses fluorescence into multiple orders At 1.2 pixel/cm-1 at 600 nm, dispersion Depends on wave number, an alternate embodiment is to replace IE with a second IM for camera. |
| JM. Three axis rotation mount for IM Opto Sigma | This mount directs IM so that fluorescence beam from collimator lens, L1 is centered on wedge, G. |
| JE. Three axis rotation mount for IE. Opto Sigma | This mount directs IE so that the dispersed Fluorescence beam is centered on the camera lens, L2. |
| L1. Achromatic, fast, collimator lens Opto Sigma | Converts the light emerging from the input Fibers into a parallel beam for IM. |
| L2. Achromatic, fast, camera lens Opto Sigma | Focuses the collimated and dispersed light emerging from IE onto the CCD camera or detector. |
| M1. First Sample XY translation stage Opto Sigma | Moves and adjusts collimator lens, L1, and mount relative to the sample and input fibers. |
| M2. Second Sample XY translation stage Opto Sigma | Moves and adjusts camera lens relative to Dispersed spectra from Echelle, IE, so as to be centered on CCD camera or detector. |
| N. Metal Breadboard, 12/12 inches Opto Sigma | Holds all mounts by quarter/twenty bolts, plus posts and clamps as needed. Bolt holes On breadboard cover every square inch. |
| Q. Charge Coupled Device (CCD) Camera/Detector Santa Barbara Instruments Group, SBIG | Detects the fluorescent light focused by L2 and records cross-disposed spectre. |

FIG. 1 shows the position of the optical components in a Brewster-angle-wedge optical external cavity. The diode laser attached to the cavity is designated as A; the cavity will control the wavelength and position of its output beam for the user. The mount labeled C holds the laser fiber assembly, B, which transmits the laser light to the cavity. The translation stages D and M hold the input and output fiber assemblies C and N. They hold the corresponding collimator lenses E and K. These two translation stages control the positions of the lenses, L1 and L2, relative to their respective fiber assemblies to within one half micron. Small shifts in these translations enable the user to select the order of the Fabry-Perot, F (Y axis for D and M) and the dispersion between these orders, using the ZnSe wedge, G (X axis for D and M). The controls on the translation stages enable the user to control the wavelength transmitted by the cavity to a given output fiber to within 0.001 nm.

The ZnSe wedge may comprise other II-VI materials or may comprise III-V materials. II-VI and III-V materials refer to materials selected from the corresponding columns on the periodic table of the elements. Preferred examples of II-VI optical wedge materials include ZnS, ZnSe and CdTe. Preferred examples of III-V optical wedge materials include GaP, GaAs and GaSb.

The X and Y micrometers of the mount D change the positions of the input fiber assemblies relative to the dispersive components of the cavity. FIG. 1 designates these components as follows: Fabry-Perot filter, F, and the wedge, G. The Y-axis of the D stage determine the wavelengths transmitted by the fringes of the Fabry-Perot. The wedge displaces these multiple fringes along the X-axis by an amount determined by the input angle. In this way, the X and Y micrometers of the D stage will alter the positions at the output fiber assembly (M) relative to the wavelengths reflected from the cavity by the mirror IF. Fine adjustments in the X and Y positions change both the wedge and Fabry-Perot fringe pattern location.

The translation stage, D, determines the positions of the input fibers relative to the ZnSe wedge (X axis) and the Fabry-Perot (Y axis). For each input fiber there will be a corresponding output fiber for any given angle of the mirror IF shown in FIG. 1. Thus any given set of wavelength bands can be selected for transmission output by properly positioning the X and Y axes of the output fiber assembly translation stage M. Different narrow spectral bands then enter each of the output fibers located at slightly different X and Y axes positions as determined by the angular dispersions of the components. In one embodiment built for sale, the stages D and M are adjusted by hand held micrometers. In other embodiments these four axes may be controlled by automatic means, such as Piezo-electric transducers or motors.

The coated mirror, labeled IM, has a two axis kinematic mount labeled JM. The user adjusts this mirror so as to direct the laser light toward the wedge at an angle such that laser light passes repeatedly through the wedge parallel to the base as shown in FIG. 1. The circular wedge, G is held at the proper dispersion angle by a rotation tube positioned inside the dual axis mount, H. The coated mirror, labeled IF, has a two axis kinematic mount labeled JF. Only those narrow laser wavelength bands and polarization modes dispersed by the wedge toward the normal of the mirror IF are reflected back toward the laser cavity. Other wavelength bands and polarization states are not amplified (lost to the internal cavity) on repeated passes. The orientation of the IF mirror specifies a unique output mode (or wavelength) of light that can propagate. The cavity, or IK mirror and its mount JK, transmit a small fraction of this given wavelength toward a particular location in the output fiber assembly Q, and reflect the remainder of the light back toward the wedge such that the light passes parallel to the base of the wedge.

The wedge base angle is specifically chosen to be nearly the Brewster angle, or arctan (nc), where nc is the refractive index of the wedge coating. Brewster angle wedges have been made from high dispersion materials like ZnS (Cleartran), ZnSe and SFL-6 glass by our vendors for this invention. These three different materials were selected to provide a range of dispersions and resolutions greater than a factor of five. They have transmission limits that range from 300 nm for the SFL-6 glass to 550 nm for ZnSe. The materials were chosen to operate across the wavelength range (350 to 800 nm) used by more than 90% of today's fluorescence applications.

The high throughput of the wedge optics shown FIG. 1 can accommodate hundreds of fibers, because of the high index of refraction of the wedge and the large field of view of the Fabry-Perot optics. Each fiber can have a diameter (of the transmitting core) as small as 10 microns. The smallest graduations on the four D and L micrometer scales are about 0.5 microns. Thus the translation stage adjustments enable the user to standardize a repeatable calibration fringe pattern within 1/20 of the diameter of a given fiber. Each different fiber can be made to transmit a specific wavelength of light to the end stage application, typically a fluorescence spectrometer or telecommunications device. The larger the individual fiber diameters, the better the user can center the spectral images. If the micrometers are moved by several of these graduations, the calibration may change slightly.

The input and output micrometer motions on the translation stages have locks on both the X and Y-axes. The mounts that hold the fiber assemblies to the translation stages, C and N, have external class 40 threads that are about 1.008 inches external diameter. The translation stage has the same size internal thread, which has an ID of 1.008 inches and is also a class 40 thread. Both the C and N mounts can accommodate an assembly of fibers with a diameter of 6.4 mm or about 6400 microns. Since each fiber has a diameter of 10 microns, the maximum number of fibers possible is not more than $(6,400/10)^2$ or a little over 400,000 fibers. In near term applications the fiber cladding diameter will limit the number of fibers used to not more than a few thousand. Even in these cases the external cavity laser diode will still be capable of dividing the tunable spectral range into thousands of different spectral channels.

For etalons (Fabry-Perot filter F) with a thickness of one centimeter, these spectral steps may be as narrow as 0.001 nm wide at near infrared wavelengths and may be several times smaller at visual wavelengths. (The etalon comprises two flat parallel reflecting surfaces that allow the calibration of the cavity.) The resolution of the spectral band pass depends upon the thickness of these etalons and their finesse. The etalon finesse increases with the reflectivity, smoothness and flatness of the plates. Typical etalon thickness values for these applications range between 0.025 cm and several cm. The actual width of the spectral band pass in wavenumber units is inversely proportional to the finesse of the etalons, typically about 50 times a quantity known as the free spectral range. This free spectral range is the reciprocal of twice the etalon thickness times its refractive index. The etalon material used is typically fused quartz or silica, with a refractive index of about 1.5 at visual and near infrared wavelengths.

Different embodiments of the invention are possible in addition to those shown in FIG. 1. As mentioned above, the instrument may use motorized translation stages (available either from New Focus or Opto Sigma). These are activated in each case by their piezoelectric means, which are under computer control. Thus the device shown in FIG. 1 may comprise an automatically tunable laser cavity whose cost is relatively low. The cavity can be selectively tuned over a range at least as large as grating systems, from 10 nm at visual wavelengths to 70 nm in the near infrared.

The lens collimation optics and the required fiber optics are available from many optical companies, including Newport Optical, Edmonds Scientific, Opto Sigma and Thor Laboratories. The required initial adjustments for the external cavity can be set at the PHI laboratory using commercial micrometer mounts from companies such as Thor Laboratories and Opto Sigma Corporation. The retro-reflector or mirror is tilted by small amounts by piezo-electric means in most external cavities available commercially. In several embodiments of this invention the beam will be tilted slightly by acousto optic means. Such crystals are available from Brimrose Corporation and Crystal Technology.

Tests at three independent laboratories (in California, New Mexico and Indiana) have shown that these materials do have the three required characteristics for an efficient external laser cavity: high spectral dispersion, high resolution and low levels of scattered light. Our vendors custom make these wedges from semiconductor and glass materials that are normally used in the mid to long wavelength infrared regions of the spectrum. These vendors also custom coat the wedges to minimize both reflection and absorption light losses at visible and near infrared wavelengths. When operated at a wedge angle that is within a few degrees of Brewster's angle, the losses will be as low as 1%, which make them nearly ideal for many passes within a cavity.

Controlling Equations for the External Laser Cavity

External laser cavities must be adjusted so that the cavity length contains a half-integral number of wavenumber units. These adjustments require that the cavity mirror reflect light from different parts of the grating back to the same laser source with the same optical path. They do change with the wavenumber output and band pass of the laser. A recent patent for the Littman Metcalf system by Moore et al (1999) requires both translation and rotation motions of the cavity mirror and its mount assembly. The required equations are related to the differential of the grating equation for the diffraction angle, $\Delta\theta d$ times the distance between the centers of the grating and pivot mirror, hm. The Littman Metcalf equation for the change in the optical path, $\Delta P$ in cm, of the pivot translation length versus unit wavenumber, $\Delta\omega$ in cm−1, is given by (1):

$$\Delta P/\Delta\omega = hm\ \Delta\theta d = hm\ SM/\omega^2, \quad (1)$$

where hm is in cm, $\omega$ is the wavenumber in cm−1, S is grating parameter or the number of grooves per cm, and M is the grating order number, usually a small integer.

The Littman Metcalf equation for the change in the independent pivot rotation angle, $\theta p$, per unit wavenumber, $\theta\omega$, is given by (2):

$$\Delta\theta p/\Delta\omega = [4\omega^3 + 2\omega\Delta\omega SM(1-\sec\theta r\ \tan\theta b)]/\omega^4\ \sec\theta p\ \tan\theta p = \quad (2)$$

or approximately $4/\omega\ \sec\theta p\ \tan\theta p$, where $\theta r$ is the reflection angle of the grating relative to the input laser beam and the normal to the grating and $\theta b$ is the grating-blaze angle.

These equations show that the motions required for the pivot mirror are complex and highly non linear in the Littman-Metcalf case. Note that equation (1) depends on both the grating parameter and the reciprocal square of the wavenumber and that equation (2) is quite non linear in the pivot angle and also depends on the reciprocal of the wavenumber. The user must simultaneously align two angles in the pivot motion equation and contend with different relations for wavenumber dependence. These facts rule out a simple translation of the input beam control mirror. Hence, design and fabrication of dual mirror pivot mounts are expensive and are a major reason why precision external cavities cost $25K, even in mass production. It follows that precision fluorometers and Raman spectrometers and other sensors that utilize such cavities to stabilize the light source will cost twice as much as the spectrometer or fluorometer alone.

The external cavity having a Brewster angle wedge simplifies cavity design, reduce costs and increase alignment accuracy. The two controlling equations for the Brewster angle wedge are based on the change in the wedge dispersion versus wavenumber. These equations can be simplified in the Brewster angle case to the simple relations (3) and (4) below:

$$\Delta P/\Delta\omega = 2(\Delta nw/\Delta\omega)D, \quad (3)$$

$$\Delta\theta w/\Delta\omega = 2(\Delta nw/\Delta\omega), \quad (4)$$

where D is the constant diameter of the circular wedge and $(\Delta nw/\Delta\omega)$ is the change of the wedge bulk index of refraction with wavenumber. Both translation and angle have the same dependence on wavenumber. The refractive index varies directly with the wavenumber, modified by the Sellmeier constants of the wedge material. The path and the angle of the input beam are directly related to wavenumber only by this refractive index gradient. This means that if the focal length of this input beam is approximately equal to D, then a simple translation of the beam will meet the requirements of equations 3 and 4, as the laser wavenumber is varied. Hence a simple translation of the beam is easy to achieve with either a fiber input lens and micrometer means or by changing the voltage on an acousto optical crystal inserted in the beam. Either method will be less expensive, more accurate and less costly than the complex reflector pivot motions required by equations (1) and (2) for the grating.

There are additional advantages to using a Brewster angle wedge in the laser cavity as opposed to a grating and the Littman-Metcalf. These advantages include increased photon efficiency of the cavity, higher dispersion (wavenumber sensitivity) and higher spectral resolution. The equations and tables below are a comparison between the performance of the Brewster angle wedge and Littman Metcalf external cavities.

The Brewster angle wedge spectral resolution computed in Table II is given by (5a):

$$(\omega/\Delta\omega)p = Bl\omega(\omega dnw/d\omega) \quad (5a)$$

where Bl is the projected wedge base length. This is twice the wedge circular diameter, D times the tangent of the wedge half angle $\alpha$. The diffraction of the light within the wedge limits the resolution, and this formula results from the usual Rayleigh resolution criterion. Typical values for ZnSe wedges at and around 590 nm are: $dnw/d\omega = 0.3$ per micron−1 and $\omega = 1.7$ micron−1, so that $\omega dnw/d\omega = 0.5$. The numbers given in Table II apply to the sample II-VI wedges with Bl=2 cm, about the size of the prototype hardware described by the Figures.

Diffraction also limits the grating resolution as given by (5b):

$$(\omega/\Delta\omega)g = Bg\omega(\sin ig + \sin id) \quad (5b)$$

Where Bg is the width of the ruled surface (assume Bg=Bl to compare performance) and ig is the input laser beam angle relative to the grating normal. The angle id is the diffraction angle measured from the grating normal. The numbers given in Table II assume that the sum of the sines of the angles in (5b) is kept below 0.4 to increase grating efficiency and reduce scattered laser light as described in the previous section.

The analogous formula for the spectral resolution of the Fabry-Perot etalon is given by (5c):

$$(\omega/\Delta\omega)e = Be\omega 2\ ne\ Fe \quad (5c)$$

Where ne is the etalon refractive index (about 1.5) and Fe is its finesse. In the ideal case of extreme flatness of the etalons, $Fe = (pi\ \sqrt{r})/(1-r)$ or about 50, if r=0.94, as is typical for modern ZnS coatings of quartz plates at 600 nm. CVI Laser can now mass produce etalons of this quality at low cost. This is why the etalon resolution can be more than 150 times either grating or prism for an etalon thickness, Be, approximately equal to Bg or Bl.

The wedge linear dispersion versus wavenumber computed in Table III is given by (6a):

$$(\Delta x/\Delta\omega)p = 2Fc(\omega Bm\ cm^2/np\ (1-Cm^2\ \omega^2)^2\ (\sin\alpha\ \sec\theta) \quad (6a)$$

where, Fc is the focal length of the camera fiber optics, np is the wedge bulk refractive index, Bm and Cm are the Sellmeier constants for the wedge material and $\theta$ is the entrance and exit angle relative to the normal to the wedge face.

The grating linear dispersion is proportional to the tangent of the blaze angle, θb:

$(\Delta x/\Delta\omega)g = 2 \, Fc \tan \theta b/\omega$, which is also shown in Table III. (6b)

TABLE II

| | Grating Versus Wedge | (Brewster | |
|---|---|---|---|
| Wavelength nm | Wavenumber Mat. cm-1 | Angle) Wedge Resolution (ω/Δω) w | Spectral Resolution Wedge/Grating Resolution (ω/Δω)w/(ω/Δω)g |
| 400 | 25,000 | ZnS 42,000 | 2.1 |
| 500 | 20,000 | ZnSe 36,000 | 2.3 |
| 600 | 16,667 | ZnSe 16,600 | 1.2 |

TABLE III

| | Grating Versus Wedge | (Brewster Angle) | | Spectral Dispersion |
|---|---|---|---|---|
| Wavelength | Wavenumber Mat. | Wedge Dispersion | | Wedge/Grating Dispersion |
| nm | cm-1 | name | (ΔX/Δω)p | (Δx/Δω)p/(Δx/Δω)g |
| 400 | 25,000 | ZnS | 3.80 | 3.85 |
| 500 | 20,000 | ZnS | 1.80 | 1.70 |
| 600 | 16,667 | ZnSe | 1.90 | 1.90 |

Wedge dispersion units are in microns/cm-1 for a camera focal length, Fc=5 cm.

The grating efficiency shown in Table IV is given by (7):

$Geff = rg(1 - \sin \theta b \tan \theta r)$, (7)

where rg is the reflectivity of the coating on the grating grooved face, assumed to be a dielectric coating with an efficiency of 99.%, and the other parameters are defined as in equation (2).

Equation (7) shows that grating efficiency is limited by both its reflectivity and blaze angles, but higher blaze angles, θb, are needed for higher grating dispersion, as given by (6b). The highly desired low input reflectivity angles, θr, then result in large cavity sizes, as shown in Table IV. These conflicting design requirements limit the efficiency of the Littman Metcalf system. The efficiency of the Brewster angle wedge is very high, Peff>99%, and is not very sensitive to wavelength and can be further improved with dielectric coatings.

TABLE IV

Grating Efficiency Results from Equation (7)

| Reflection angle Blaze angle units | Mirror-Grat. distance, hm (cm) | Geff, or grating efficiency fraction |
|---|---|---|
| 1 | 3.17 | 0.905 |
| 2 | 1.43 | 0.789 |
| 3 | 0.78 | 0.608 |

Table IV assumes the grating blaze angle unit is 17.5 degrees and an ideal reflectivity of 90.%.

In contrast, the wedge reflectivity, Peff, will approximately equal total efficiency (wedge absorption is small) and will exceed 90.%, at all wavelengths, between 400 and 700 nm, depending on the coatings.

The scattered light levels result from light reflected at angles off axis to the main laser beam, the designations are Slg, if due the grating and Slw, if due to the wedge as given by Equation (8):

$Slg = 1 - Geff$; $Slw = 1 - Peff$. (8)

Note that the Brewster angle wedge scattered light is thus computed to be at least 10 times lower than those for grating and mirror units of similar size, provided the antireflection coatings on the wedge are of the quality specified by Table IV.

MOUNTING STRATEGY

The proposed mounting strategy shown in FIGS. 1 and 2 requires three mirrors instead of the minimum of two required for most cavities. The multi mirror design enables rapid assembly and alignment, since only the wedge must be translated to change the entrance angles with changing wavelength. Both entrance and exit angles that the laser beam makes with the wedge normal, Wa, are the same and constant at each laser wavelength. They both decrease at the same rate with increasing laser wavelength as shown in the Table V below. The ZnSe wedge is said to be at minimum deviation for the light beam at the given angles. The mirror mounts JM and JK are both adjusted on a rotating stage to the precise angle, Ma, given in Table V.

These Ma angles will increase at the proper rate with wavelength increase as the wedge is translated toward the top of FIGS. 1 and 2. The entrance and exit angles with respect to the wedge are labeled on these Figures and given numerically in Table V.

The wedge itself is mounted on a linear stage below the H TOP MIKE. It is mounted parallel to the holes in the breadboard on a linear stage that moves parallel to the laser light entering the cavity from the fibers on the right side of FIG. 1. The linear stage is adjusted for each laser wavelength as shown in the last column of Table V. All mounts are in stock items available from Opto Sigma. The mirror mount JF is oriented precisely normal to the incoming and outgoing laser beam. A small percentage of the light emerges from the cavity at the mirror IK, since this mirror has partial transparency. The coating on this mirror determines the number of times the laser light circulates in the cavity. Absorption losses in the coated optics are less than 1%.

TABLE V

Mounting Parameters for Current Prototype based on a 38 Degree ZnSe Wedge

| Wavelength Nanometers | Wedge Angle, Wa Degrees | Mirror Angle, Ma Degrees | Wedge Shift microns/nanometer |
|---|---|---|---|
| 500 | 68.3 | 40.7 | |
| 550 | 62.0 | 47.0 | 34.7 |
| 600 | 58.4 | 50.6 | 16.9 |
| 700 | 54.5 | 54.5 | 8.2 |

The low cost devices and methods described above result in the following capabilities for laser control optics of a given size (with respect to prior devices): (1) a simple means to enable of the beam pivot motions required to maintain the cavity, (2) an increase in angular dispersion of a factor of about 2 to about 4 depending on the wavelength, (3) an increase in light throughput (angular field of the fiber assembly) by a factor equal to the dispersion increase, (4) an increase in spectral resolution by a factor of between about 1.2 and 3, (5) a significant increase in the light transfer efficiency per photon pass within the cavity (from about 80% to over 90%) and a (6) a corresponding decrease in scattered light by a factor of 10 or more. Each of these capabilities enable reduction in the size of the external cavity by factors of as high as two and the fabrication costs by factors of five or more. These improvements will make possible novel applications for diode lasers, increasing their market share.

Potential markets for this invention include, but are not limited to the following areas: (1) Provide all laboratories with compact and tunable laser diodes that have high wavelength resolution and stability. Many modern laboratories require sensors with a high specificity of detection, which is increased if the diode is stable and tunable during the measurements. (2) Create better quality diode laser beams for Raman and fluorescence spectroscopy. Both these fundamental techniques will lower the cost of measurements in biotechnology, chemical detection, medical fields as well as related laboratory sciences. (3) Tunable, stable lasers can be used to more rapidly map the genomic and protein structures with micro-array technology. Current micro-arrays measurements use state of the art light sources, which take about 5 minutes per sample. The increase in the demand for rapid analyses of genomes and proteins can only be met by reducing this micro-array measurement time to seconds by increasing laser power and stability. (4) There is a growing demand for optical telecommunications and optical computer components. Large increases in both the numbers of channels for wavelength division multiplexers and the rate of information storage are urgently needed. (5) Recent international events have stimulated growth in certain defense and forensic science applications. These applications require lasers that are compact (for stealth and portability), and have high resolution and stability, as well as low cost, simplicity and specificity. The new invention described here will make possible the fabrication of such laser systems.

The Brewster angle wedge may also be made from III V and class IV semiconductor materials. These materials also have very high dispersion, but are generally more expensive to fabricate in bulk form as high precision wedge windows. Nevertheless, these materials may be used in the optical laser cavity described above.

In addition, the Brewster angle wedge may be used in any spectrometer, fluorometer, or optical cavity. Thus, while the preferred embodiments of the devices and methods have been described in reference to the environment in which they were developed, they are merely illustrative of the principles of the inventions. Other embodiments and configurations may be devised without departing from the spirit of the inventions and the scope of the appended claims.

I claim:

1. An optical cavity comprising:
   an entrance aperture for receiving frequencies of input light from a laser, said entrance aperture adapted to restrict the spatial extent of the input light, whereby the input light becomes restricted input light after interacting with the entrance aperture;
   collimating optics disposed to receive the restricted input light, said collimating optics capable of collimating the restricted input light, whereby the restricted input light becomes collimated light after interacting with the collimating optics;
   a Brewster angle optical wedge disposed to receive the collimated light, said wedge comprising a semiconductor material, whereby the collimated light becomes imaged light after interacting with the wedge;
   focusing optics disposed to receive the imaged light, whereby the imaged light becomes output light after interacting with the focusing optics; and
   reflective optics disposed to receive the output light, said reflective optics adapted to allow pre-selected wavelengths of the output light to pass outside the optical cavity and to reflect all other wavelengths of the output light back into the optical cavity said reflective optics comprising:
   an output light spatial and spectral array which selects output light frequencies using an output focal plane and a fiber array; and
   an electronically operated mirror array which returns all other dispersed frequencies to the cavity.

2. The cavity of claim 1 wherein the entrance aperture is attached to a single fiber coupled the laser.

3. The cavity of claim 1 wherein the laser comprises an array of diode lasers, the entrance aperture comprises an array of entrance apertures and the array of entrance apertures is attached to an array of fibers coupled to the array of diode lasers.

4. The cavity of claim 1 wherein the collimating optics comprise a mirror.

5. The cavity of claim 1 wherein the collimating optics comprise a lens.

6. The cavity of claim 1 wherein the focusing optics is further adapted to spatially distribute the imaged light.

7. The cavity of claim 1 wherein the wedge comprises a coated clear crystal comprising a II-VI material.

8. The cavity of claim 7 wherein the II-VI material is selected from the group consisting of ZnS, ZnSe and CdTe.

9. The cavity of claim 1 wherein the wedge comprises a coated clear crystal comprising a III-V material.

10. The cavity of claim 9 wherein the III-V material is selected from the group consisting of GaP, GaAs and GaSb.

11. An optical cavity comprising:
    an entrance aperture for receiving frequencies of input light from a laser, said entrance aperture adapted to restrict the spatial extent of the input light, whereby the input light becomes restricted input light after interacting with the entrance aperture;
    collimating optics disposed to receive the restricted input light, said collimating optics capable of collimating the restricted input light, whereby the restricted input light becomes collimated light after interacting with the collimating optics;
    spectral separation optics, said spectral separation optics disposed to receive the collimated light, whereby the collimated light becomes spectrally separated light after interacting with the spectral separation optics;
    a Brewster angle optical wedge disposed to receive the spectrally separated light, said wedge comprising a semiconductor material, whereby the spectrally separated light becomes imaged light after interacting with the wedge;
    focusing optics disposed to receive the imaged light, whereby the imaged light becomes output light after interacting with the focusing optics; and
    reflective optics disposed to receive the output light, said reflective optics adapted to allow pre-selected wavelengths of the output light to pass outside the optical cavity and to reflect all other wavelengths of the output light back into the optical cavity.

12. The cavity of claim 11 wherein the spectral separation optics comprise an echelle grating.

13. The cavity of claim 11 wherein the spectral separation optics comprise a dichroic mirror.

14. The cavity of claim 11 wherein the optical wedge comprises a right circular wedge having a base, wherein the spectral separation optics and the wedge are disposed relative to each other such that light passing through the spectral separation optics passes through the wedge parallel to the base of the wedge.

15. An optical cavity comprising:

an entrance aperture for receiving frequencies of input light from a laser, said entrance aperture adapted to restrict the spatial extent of the input light, whereby the input light becomes restricted input light after interacting with the entrance aperture;

collimating optics disposed to receive the restricted input light, said collimating optics capable of collimating the restricted input light, whereby the restricted input light becomes collimated light after interacting with the collimating optics;

spectral separation optics, said spectral separation optics disposed to receive the collimated light, whereby the collimated light becomes spectrally separated light after interacting with the spectral separation optics;

a Brewster angle optical wedge disposed to receive the spectrally separated light, said wedge comprising a semiconductor material, whereby the spectrally separated light becomes imaged light after interacting with the wedge;

filtering optics disposed to receive the imaged light, whereby the imaged light becomes filtered light after interacting with the filtering optics;

focusing optics disposed to receive the filtered light, whereby the spectrally filtered light becomes output light after interacting with the focusing optics; and reflective optics disposed to receive the output light, said reflective optics adapted to allow pre-selected wavelengths of the output light to pass outside the optical cavity and to reflect all other wavelengths of the output light back into the optical cavity.

16. The cavity of claim 15 wherein the filtering optics comprise a dichroic filter.

17. The cavity of claim 15 wherein the filtering optics comprise an etalon.

18. The cavity of claim 15 wherein the focusing optics is adapted to spatially distribute the filtered light.

19. The cavity of claim 15 wherein the Brewster angle optical wedge has a base, wherein the spectral separation optics and the wedge are disposed relative to each other such that the spectrally separated light passes through the wedge parallel to the base of the wedge.

* * * * *